(12) United States Patent
Seki et al.

(10) Patent No.: US 10,283,568 B2
(45) Date of Patent: *May 7, 2019

(54) LIGHT EMITTING APPARATUS HAVING FIRST LUMINOUS BODY AND SECOND LUMINOUS BODY

(71) Applicants: PIONEER CORPORATION, Kawasaki-shi, Kanagawa (JP); TOHOKU PIONEER CORPORATION, Tendo-shi, Yamagata (JP)

(72) Inventors: Shuichi Seki, Yonezawa (JP); Masaki Murakata, Yonezawa (JP); Katsuhiro Kanauchi, Yonezawa (JP)

(73) Assignees: PIONEER CORPORATION, Kawasaki-Shi, Kanagawa (JP); TOHOKU PIONEER CORPORATION, Tendo-Shi, Yamagata (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/215,094

(22) Filed: Jul. 20, 2016

(65) Prior Publication Data

US 2016/0329382 A1 Nov. 10, 2016

Related U.S. Application Data

(63) Continuation of application No. 14/426,856, filed as application No. PCT/JP2012/073099 on Sep. 10, 2012, now Pat. No. 9,419,059.

(51) Int. Cl.
*H01L 27/32* (2006.01)
*H01L 51/00* (2006.01)
(Continued)

(52) U.S. Cl.
CPC ...... *H01L 27/3202* (2013.01); *H01L 27/3204* (2013.01); *H01L 51/0096* (2013.01);
(Continued)

(58) Field of Classification Search
CPC combination set(s) only.
See application file for complete search history.

(56) References Cited

U.S. PATENT DOCUMENTS 6,437,769 B1 8/2002 Kobayashi et al.
2005/0017621 A1 1/2005 Leo
(Continued)

FOREIGN PATENT DOCUMENTS

JP 2000098919 A 4/2000
JP 2000252063 A 9/2000
(Continued)

OTHER PUBLICATIONS

International Search Report for PCT App No. PCT/JP2012/073099 dated Dec. 18, 2012.

*Primary Examiner* — Mamadou L Diallo
(74) *Attorney, Agent, or Firm* — Procopio, Cory, Hargreaves & Savitch LLP

(57) ABSTRACT

A first luminous body is formed on a substrate and is linear. A second luminous body is also formed on the substrate and is linear. The second luminous body extends in parallel with the first luminous body. A first anode and a first cathode are formed on the substrate, and supply electric power to the first luminous body. A second anode and a second cathode are also formed on the substrate, and supply electric power to the second luminous body. The first anode and the first cathode extend in parallel with each other, and the second anode and the second cathode extend in parallel with each other. In a range overlapping with the first luminous body when seen in a plan view, the first anode is not connected to (Continued)

the second anode, and the first cathode is not connected to the second cathode.

13 Claims, 11 Drawing Sheets

(51) Int. Cl.
*H01L 51/50* (2006.01)
*H01L 51/52* (2006.01)
*H01L 51/56* (2006.01)

(52) U.S. Cl.
CPC ...... *H01L 51/5056* (2013.01); *H01L 51/5072* (2013.01); *H01L 51/5088* (2013.01); *H01L 51/5092* (2013.01); *H01L 51/5206* (2013.01); *H01L 51/5209* (2013.01); *H01L 51/5212* (2013.01); *H01L 51/5221* (2013.01); *H01L 51/5225* (2013.01); *H01L 51/5234* (2013.01); *H01L 51/56* (2013.01); *H01L 2251/5361* (2013.01)

(56) References Cited

U.S. PATENT DOCUMENTS

| 2009/0058278 A1* | 3/2009 | Ushikubo | C09K 11/06 313/504 |
| 2011/0163337 A1 | 7/2011 | Shiang et al. | |
| 2014/0353657 A1* | 12/2014 | Hayashi | H01L 51/5203 257/40 |

FOREIGN PATENT DOCUMENTS

| JP | 2001117525 A | 4/2001 |
| JP | 2002216961 A | 8/2002 |
| JP | 2004119147 A | 4/2004 |
| JP | 2004227929 A | 8/2004 |
| JP | 2005502994 A | 1/2005 |
| JP | 2007072033 A | 3/2007 |
| JP | 2007311159 A | 11/2007 |
| JP | 2007324063 A | 12/2007 |
| JP | 2012104316 A | 5/2012 |

* cited by examiner

FIG. 11

| LUMINESCENT PATTERN | $(\alpha - \beta)/\alpha \times 100$ | | | | | |
|---|---|---|---|---|---|---|
| | 1 | 2 | 5 | 10 | 20 | 30 |
| WHITE COLOR | ○ | ○ | ○ | ○ | × | × |
| RED COLOR | ○ | ○ | ○ | ○ | △ | × |
| GREEN COLOR | ○ | ○ | ○ | ○ | △ | × |
| BLUE COLOR | ○ | ○ | ○ | ○ | ○ | × |

○ : RARELY RECOGNIZABLE
△ : RECOGNIZABLE BUT IN ALLOWABLE RANGE
× : RECOGNIZABLE

LIGHT EMITTING APPARATUS HAVING FIRST LUMINOUS BODY AND SECOND LUMINOUS BODY

CROSS-REFERENCE TO RELATED APPLICATIONS

Pursuant to 35 U.S.C. §119(e), this application is a continuation application of U.S. patent application Ser. No. 14/426,856, filed Mar. 9, 2015, which is a national stage entry of PCT application No. PCT/JP2012/073099, filed on Sep. 10, 2012, the contents of which are incorporated by reference.

TECHNICAL FIELD

The present invention relates to a light emitting apparatus.

BACKGROUND ART

One of the devices for converting electric energy into light is an organic electro luminescence (EL) device. The organic EL device has a structure in which an organic light emitting layer is interposed between two electrodes. For example, in Patent Document 1, one electrode is a solid electrode, and an organic light emitting layer and the other electrode are linear.

In addition, in Patent Document 2, an adjusting resistor is disposed between a driving circuit and each pixel. The adjusting resistor is disposed to adjust current density flowing in each pixel.

Further, in Patent Document 3, by making the length of wiring from a connector to the scanning electrode redundant in an organic EL display including a scanning electrode and a data electrode, resistance values of these wirings become approximately identical to each other. Accordingly, it is possible to suppress a variation in the luminance of a display element.

RELATED DOCUMENT

Patent Document

[Patent Document 1] Japanese Laid-open Patent Publication No. 2000-252063
[Patent Document 2] Japanese Laid-open Patent Publication No. 2001-117525
[Patent Document 3] Japanese Laid-open Patent Publication No. 2007-72033

DISCLOSURE OF THE INVENTION

When the light emitting apparatus including the organic light emitting layer is used as a light source, a plurality of light emitting apparatuses having identical structures may be used in parallel. In this case, it is necessary to make a boundary line of the plurality of light emitting apparatuses obscure according to usage. For this reason, it is desirable to design the light emitting apparatus such that a difference in the luminance of the boundary line between the adjacent light emitting apparatuses falls within a constant range.

On the other hand, in the light emitting apparatus including the organic light emitting layer, in order to stabilize the voltage, the cathode may often be the solid electrode, and the organic light emitting layer and the other electrode may often be linear. As a result of consideration of the present inventors, it has been found that, in such a structure, luminance is changed even when the same voltage is applied to the same organic light emitting layer in a case where the entire organic light emitting layer emits light, and in a case where only a part of the organic light emitting layer emits light. For this reason, in the structure described above, it is difficult to design the light emitting apparatus such that a difference in luminance at the boundary line between the adjacent light emitting apparatuses falls within a constant range in both the case where the entire organic light emitting layer emits light, and the case where only a part of the organic light emitting layer emits light.

An example of an object of the present invention is to enable a light emitting apparatus including an organic light emitting layer to be designed such that a difference in luminance at a boundary line between adjacent light emitting apparatuses falls within a constant range in both a case where the entire organic light emitting layer emits light, and a case where only a part of the organic light emitting layer emits light.

The invention according to Claim 1 is a light emitting apparatus including a substrate; a first luminous body which is formed on the substrate, includes a first organic light emitting layer, and is linear; a second luminous body which is formed on the substrate, includes a second organic light emitting layer, is linear, and is parallel with the first luminous body; a first anode and a first cathode which extend in the same direction, and interpose the first luminous body therebetween; and a second anode and a second cathode which extend in the same direction, and interpose the second luminous body therebetween, in which the first anode is not connected to the second anode, and the first cathode is not connected to the second cathode.

The light emitting apparatus according to Claim 8 is a light emitting apparatus in which a plurality of the light emitting apparatuses according to Claim 1 are connected in series.

BRIEF DESCRIPTION OF THE DRAWINGS

The object described above, and other objects, characteristics, and advantages will become more obvious with reference to the following preferred embodiments and the following drawings attached thereto.

FIG. 11 is a diagram for illustrating an effect of the light emitting apparatus 10 according to the first embodiment.

DESCRIPTION OF EMBODIMENTS

Figure 1:
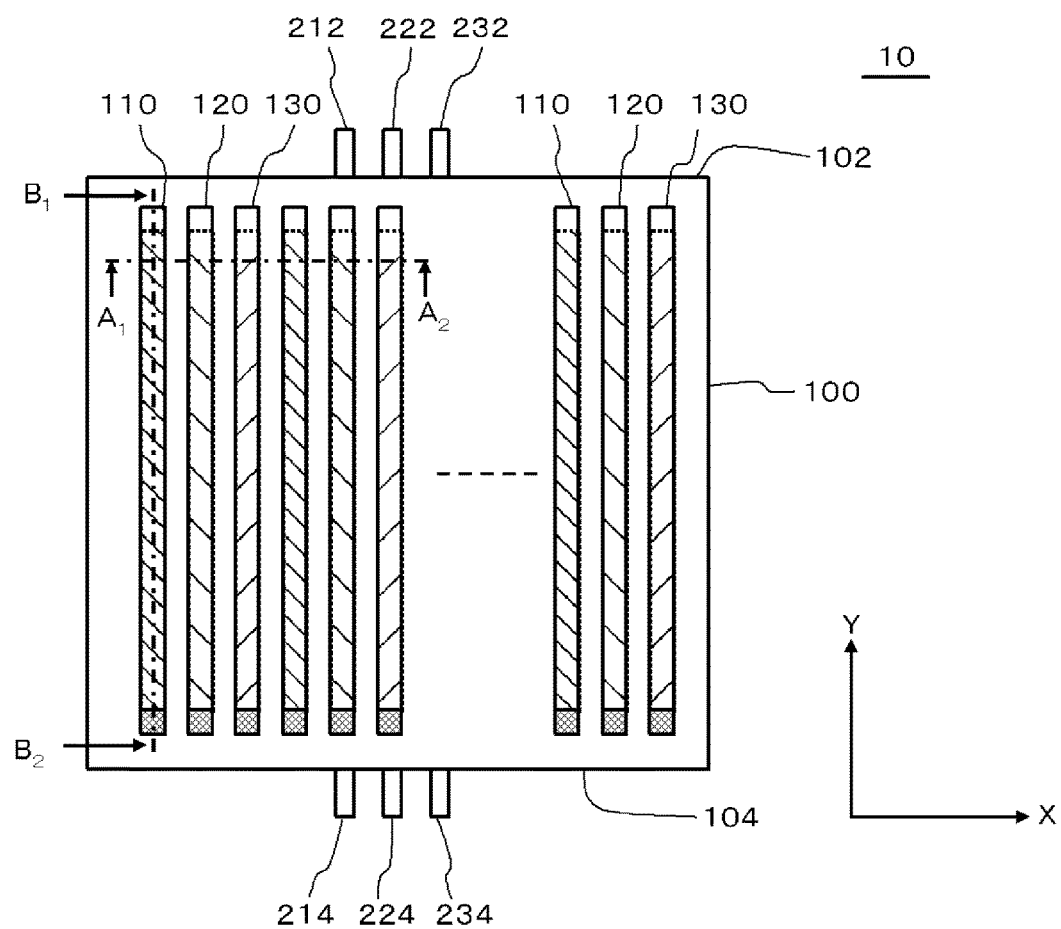
FIG. 1 is a plan view illustrating a configuration of a light emitting apparatus according to a first embodiment.

Hereinafter, embodiments of the present invention will be described with reference to the drawings. Furthermore, in all of the drawings, the same reference numerals are applied to the same constituent parts, and the description thereof will not be repeated.

First Embodiment

Figure 2:
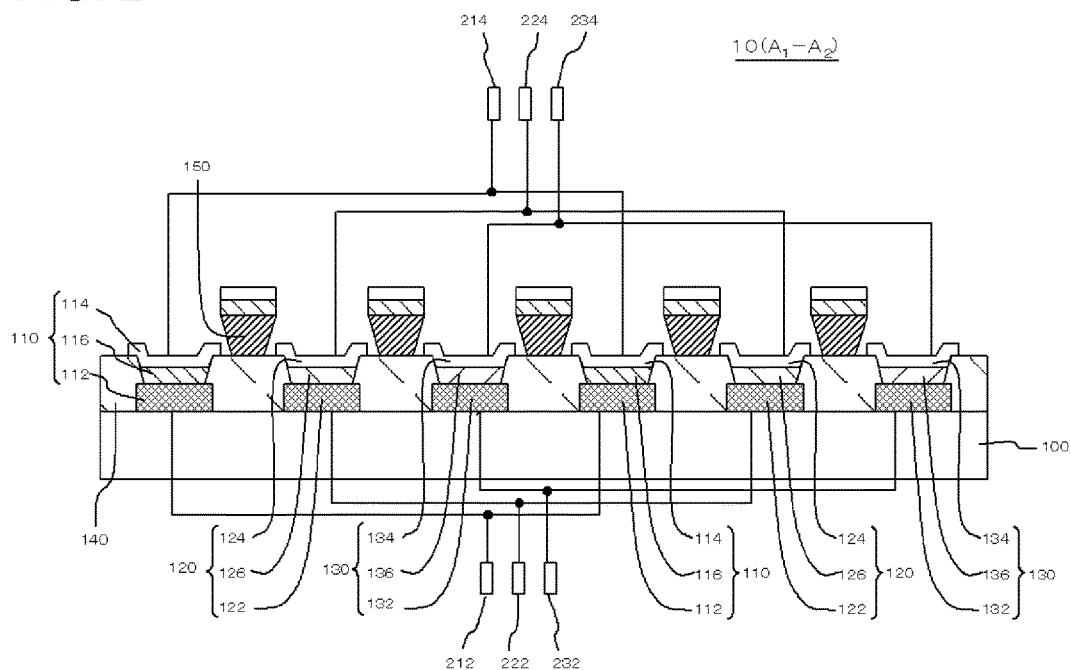
FIG. 2 is an $A_1$-$A_2$ cross-sectional view of FIG. 1.

FIG. 1 is a plan view illustrating the configuration of a light emitting apparatus 10 according to a first embodiment. FIG. 2 is an $A_1$-$A_2$ cross-sectional view of FIG. 1. The light emitting apparatus 10 according to this embodiment includes a substrate 100, a first luminous body 116, a second luminous body 126, a first anode 112, a first cathode 114, a second anode 122, and a second cathode 124. The first luminous body 116 is formed on the substrate 100, and includes a first organic light emitting layer (a light emitting layer 306 of FIG. 4). The first luminous body 116 is linear, and for example, forms a striped pattern. The second luminous body 126 is formed on the substrate 100, and includes a second organic light emitting layer (the light emitting layer 306 of FIG. 4). The second luminous body 126 is also linear, and for example, forms a striped pattern, and extends in parallel with the first luminous body 116. The first anode 112 and the first cathode 114 are formed on the substrate 100, and extend in the same direction. The first anode 112 and the first cathode 114 interpose the first luminous body 116 therebetween, and thus supply electric power to the first luminous body 116. The second anode 122 and the second cathode 124 are also formed on the substrate 100, and extend in the same direction. The second anode 122 and the second cathode 124 interpose the second luminous body 126 therebetween, and supply electric power to the second luminous body 126.

According to this embodiment, in a range overlapping with the first luminous body 116 when seen in a plan view, the first anode 112 is not connected to the second anode 122, and the first cathode 114 is not connected to the second cathode 124. For this reason, properties (for example, the amount of resistance) of the first anode 112 and the first cathode 114, and properties of the second anode 122 and the second cathode 124 are able to be designed independently of each other. In addition, as described later with reference to FIG. 7, a condition when the first luminous body 116 and the second luminous body 126 emit light at the same time, and a condition when the first luminous body 116 and the second luminous body 126 emit light independently are able to be identical to each other. Accordingly, when a plurality of light emitting apparatuses 10 are arranged in parallel, it is possible to design the light emitting apparatus 10 such that a difference in luminance at a boundary line of the adjacent light emitting apparatuses 10 falls within a constant range in both a case where the first luminous body 116 and the second luminous body 126 emit light at the same time, and a case where only the first luminous body 116 or the second luminous body 126 emits light. For example, in the boundary line of the adjacent light emitting apparatuses 10, when the higher luminance is $\alpha$, and the lower luminance is $\beta$, $(\alpha-\beta)/\alpha$, for example, is less than 0.30, preferably less than or equal to 0.1, and more preferably less than or equal to 0.05. Hereinafter, the details will be described.

As illustrated in FIG. 1, the light emitting apparatus 10 includes a plurality of first luminescent lines 110, a plurality of second luminescent lines 120, and a plurality of third luminescent lines 130 on the substrate 100. Specifically, the first luminescent line 110, the second luminescent line 120, and the third luminescent line 130 extend linearly in a first direction (a Y direction of FIG. 1). Then, the first luminescent line 110, the second luminescent line 120, and the third luminescent line 130 are repeatedly arranged in this order in a second direction (an X direction of FIG. 1) which is perpendicular to the first direction. For this reason, the first luminescent line 110, the second luminescent line 120, and the third luminescent line 130 are arranged on the substrate 100 at a high density, and thus it is possible to increase the emission intensity of the light emitting apparatus 10. Furthermore, an insulating layer 140 (illustrated in FIG. 2) is formed between the respective luminescent lines.

Each of the first luminescent line 110, the second luminescent line 120, and the third luminescent line 130 includes an organic light emitting layer. The first luminescent line 110, the second luminescent line 120, and the third luminescent line 130 emit light having properties which are different from each other. For example, the first luminescent line 110, the second luminescent line 120, and the third luminescent line 130 emit light having a red color, a green color, and a blue color, respectively. However, a combination of light emitted by the first luminescent line 110, the second luminescent line 120, and the third luminescent line 130 is not limited thereto.

The first luminescent line 110 includes the first anode 112 (illustrated in FIG. 2) and the first cathode 114 (illustrated in FIG. 2), the second luminescent line 120 includes the second anode 122 (illustrated in FIG. 2) and the second cathode 124 (illustrated in FIG. 2), and the third luminescent line 130 includes the third anode 132 (illustrated in FIG. 2) and the third cathode 134 (illustrated in FIG. 2). When limited to a region overlapping with the first luminescent line 110, the second luminescent line 120, and the third luminescent line 130 in an extending direction (the Y direction of FIG. 1) of the first luminescent line 110, the second luminescent line 120, and the third luminescent line 130, the first anode 112, the second anode 122, and the third anode 132 are separated from each other, and the first cathode 114, the second cathode 124, and the third cathode 134 are also separated from each other.

The light emitting apparatus 10 includes a first anode terminal 212, a second anode terminal 222, a third anode terminal 232, a first cathode terminal 214, a second cathode terminal 224, and a third cathode terminal 234. The first anode terminal 212 and the first cathode terminal 214 are terminals for supplying electric power to a plurality of first luminescent lines 110. The second anode terminal 222 and the second cathode terminal 224 are terminals for supplying electric power to a plurality of second luminescent lines 120. The third anode terminal 232 and the third cathode terminal 234 are terminals for supplying electric power to a plurality of third luminescent lines 130.

The first anode terminal 212 is disposed in a position of an edge of the substrate 100 facing one end portion of the first luminescent line 110 or in the vicinity thereof, and is connected to the first anode 112 of the first luminescent line 110. The second anode terminal 222 is disposed in a position of the edge of the substrate 100 facing one end portion of the second luminescent line 120 or in the vicinity thereof, and is connected to the second anode 122 of the second luminescent line 120. The third anode terminal 232 is disposed in a position of the edge of the substrate 100 facing one end portion of the third luminescent line 130 or in the vicinity thereof, and is connected to the third anode 132 of the third luminescent line 130.

The first cathode terminal 214 is disposed in a position of the edge of the substrate 100 facing the other end portion of the first luminescent line 110 or in the vicinity thereof, and is connected to the first cathode 114 of the first luminescent line 110. The second cathode terminal 224 is disposed in a position of the edge of the substrate 100 facing the other end portion of the second luminescent line 120 or in the vicinity thereof, and is connected to the second cathode 124 of the second luminescent line 120. The third cathode terminal 234 is disposed in a position of the edge of the substrate 100 facing the other end portion of the third luminescent line 130 or in the vicinity thereof, and is connected to the third cathode 134 of the third luminescent line 130.

By arranging the first anode terminal 212, the second anode terminal 222, the third anode terminal 232, the first cathode terminal 214, the second cathode terminal 224, and the third cathode terminal 234 in this manner, it is possible to decrease the length of wiring between these terminals and the first luminescent line 110, the second luminescent line 120, and the third luminescent line 130, and it is possible to reduce the resistance of the wiring.

The substrate 100 is rectangular. The first luminescent line 110, the second luminescent line 120, and the third luminescent line 130 extend along one side of the substrate 100. The first anode terminal 212, the second anode terminal 222, and the third anode terminal 232 are disposed on one side 102 (a first side) among the two sides of the substrate 100 perpendicular to the first luminescent line 110, the second luminescent line 120, and the third luminescent line 130. The first cathode terminal 214, the second cathode terminal 224, and the third cathode terminal 234 are disposed on a side 104 (a second side) facing the side 102.

By using such a layout, when a plurality of light emitting apparatuses 10 is arranged vertically, it is possible to easily connect the plurality of light emitting apparatuses 10 in series. This effect becomes particularly remarkable in a direction in which the sides 102 and 104 extend (the X direction of FIG. 1), when a position of the first anode terminal 212 overlaps with a position of the first cathode terminal 214, a position of the second anode terminal 222 overlaps with a position of the second cathode terminal 224, and a position of the third anode terminal 232 overlaps with a position of the third cathode terminal 234.

Next, a structure of the first luminescent line 110, the second luminescent line 120, and the third luminescent line 130 will be described with reference to FIG. 2. The first luminescent line 110 has a configuration in which the first anode 112, the first luminous body 116, and the first cathode 114 are laminated on the substrate 100 in this order. The second luminescent line 120 has a configuration in which the second anode 122, the second luminous body 126, and the second cathode 124 are laminated on the substrate 100 in this order. The third luminescent line 130 has a configuration in which the third anode 132, the third luminous body 136, and the third cathode 134 are laminated on the substrate 100 in this order.

Specifically, the respective luminescent lines are insulated by the insulating layer 140. The insulating layer 140 is formed in a region positioned between the respective luminescent lines on the substrate 100. The insulating layer 140 is not formed on an upper surface of a region excluding an end portion in an upper surface of the first anode 112, a region excluding an end portion in an upper surface of the second anode 122, or a region excluding an end portion of the third anode 132. Then, in the region in the upper surface of the first anode 112 in which the insulating layer 140 is not formed, the first luminous body 116 and the first cathode 114 are laminated in this order. In addition, in the region in the upper surface of the second anode 122 in which the insulating layer 140 is not formed, the second luminous body 126 and the second cathode 124 are laminated in this order. Further, in the region in the upper surface of the third anode 132 in which the insulating layer 140 is not formed, the third luminous body 136 and the third cathode 134 are laminated in this order.

In addition, in a portion of the insulating layer 140 positioned between the respective luminescent lines, a partition wall 150 formed of an insulating material is formed. The partition wall 150 is reversely tapered, and has an upper surface which is wider than a lower surface. The partition wall 150 is formed such that a material of the first luminous body 116, a material of the second luminous body 126, a material of the third luminous body 136, and materials of the first cathode 114, the second cathode 124, and the third cathode 134 are not formed on the insulating layer 140. That is, the partition wall 150 is disposed, and thus the luminous bodies and the cathodes of the respective luminescent lines are separated from each other.

The substrate 100, for example, is formed of quartz, glass, metal, or a resin such as plastic. When a light emitting surface of the light emitting apparatus 10 is the substrate 100, the substrate 100 is formed of a material transmitting light emitted by the first luminescent line 110, the second luminescent line 120, and the third luminescent line 130.

The first anode 112, the second anode 122, and the third anode 132 are formed of the same material. When the substrate 100 is the light emitting surface, the first anode 112, the second anode 122, and the third anode 132 are a transparent electrode of indium tin oxide (ITO), indium zinc oxide (IZO), zinc oxide (ZnO), or the like. Furthermore, when a surface of the light emitting apparatus 10 opposite to the substrate 100 is the light emitting surface, the first anode 112, the second anode 122, and the third anode 132 are formed of metal such as Al.

The first cathode 114, the second cathode 124, and the third cathode 134 are formed of the same material. When the substrate 100 is the light emitting surface, the first cathode 114, the second cathode 124, and the third cathode 134 are formed of metal such as Al. Furthermore, when the surface of the light emitting apparatus 10 opposite to the substrate 100 is the light emitting surface, the first cathode 114, the second cathode 124, and the third cathode 134 are a transparent electrode of Indium Tin Oxide (ITO), indium zinc oxide (IZO), zinc oxide (ZnO), or the like.

As illustrated in FIG. 1, the first luminescent line 110 extends linearly. A current flows into the first cathode 114 from the entire surface of the first anode 112 through the first luminous body 116. On the other hand, both of the first anode 112 and the first cathode 114 include a resistance component. For this reason, when a resistance value of the first anode 112 per unit length and a resistance value of the first cathode 114 per unit length are not substantially uniform, distribution of luminance in the first luminescent line 110 occurs in the extending direction of the first luminescent line 110. When such a distribution of luminance occurs, a difference between a one end side and the other end side of the first luminescent line 110 may be more likely to occur. In this case, a difference in luminance occurs at the boundary line between the adjacent light emitting apparatuses 10.

Therefore, in this embodiment, the resistance value of the first anode 112 per unit length is designed to be approximately identical to the resistance value of the first cathode 114 per unit length. In addition, a difference in luminance between the one end side and the other end side of the first luminescent line 110 (that is, the first cathode terminal 214 side and the first anode terminal 212 side) is designed to be small. For example, when the higher luminance between the luminance on the anode terminal side and the luminance on the cathode terminal side is a, and the lower luminance is β, $(\alpha-\beta)/\alpha<0.30$, and is preferably less than or equal to 0.1, and more preferably less than or equal to 0.05. In the configuration illustrated in FIG. 2, by adjusting the thickness or the width of the first cathode 114 and the first anode 112, it is possible to adjust the resistance value of the first anode 112 and the first cathode 114 per unit length.

For example, when one of the first anode 112 and the first cathode 114 is a transparent electrode, and the other is a metal electrode, the transparent electrode has resistance which is greater than that of the metal electrode, and thus the metal electrode is made thinner than the transparent electrode. Thus, it is possible to easily make substantially uniform the resistance value of the first anode 112 per unit length and the resistance value of the first cathode 114 per unit length.

Furthermore, the second luminescent line 120 and the third luminescent line 130 have the same configuration as that of the first luminescent line 110.

A plurality of first luminescent lines 110, a plurality of second luminescent lines 120, and a plurality of third luminescent lines 130 are each disposed on the substrate 100. Then, all of a plurality of first anodes 112 are connected to the same first anode terminal 212, and all of a plurality of first cathodes 114 are connected to the same first cathode terminal 214. In addition, all of a plurality of second anodes 122 are connected to the same second anode terminal 222, and all of a plurality of second cathodes 124 are connected to the same second cathode terminal 224. Further, all of a plurality of third anodes 132 are connected to the same third anode terminal 232, and all of a plurality of third cathodes 134 are connected to the same third cathode terminal 234. For this reason, even when the plurality of first luminescent lines 110, the plurality of second luminescent lines 120, and the plurality of third luminescent lines 130 are disposed on the substrate 100, it is possible to easily connect the plurality of first luminescent lines 110, the plurality of second luminescent lines 120, and the plurality of third luminescent lines 130 to a display driver.

Figure 3:
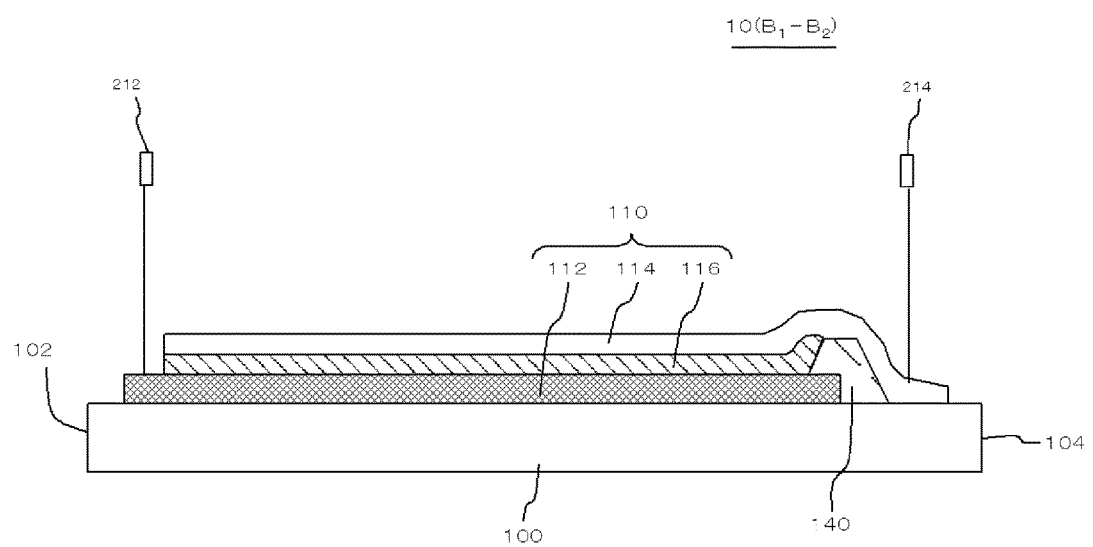
FIG. 3 is a $B_1$-$B_2$ cross-sectional view of FIG. 1.

FIG. 3 is a $B_1$-$B_2$ cross-sectional view of FIG. 1. As described with reference to FIG. 2, the first luminescent line 110 has a configuration in which the first anode 112, the first luminous body 116, and the first cathode 114 are laminated on the substrate 100. The first luminous body 116 and the first cathode 114 do not cover the end portion of the first anode 112 on the side facing the side 102. The first anode 112 is connected to the first anode terminal 212 through the portion which is not covered with the first luminous bodies 116 and 114.

In addition, the first cathode 114 is positioned to be closer to the side 104 than the first anode 112 and the first luminous body 116 in a state where the end portion on the side 104 side is insulated from the first anode 112. For example, in an example illustrated in this drawing, the insulating layer 140 is formed in an end surface of the first anode 112 and the first luminous body 116 on the side facing the side 104. Then, the end portion of the first cathode 114 on the side of the side 104 extends onto the substrate 100 by way of an end surface of the insulating layer 140. Then, the first cathode 114 is connected to the first cathode terminal 214 through a portion positioned on the substrate 100.

Furthermore, the second luminescent line 120 and the third luminescent line 130 have the same configuration as that of the first luminescent line 110.

Figure 4:
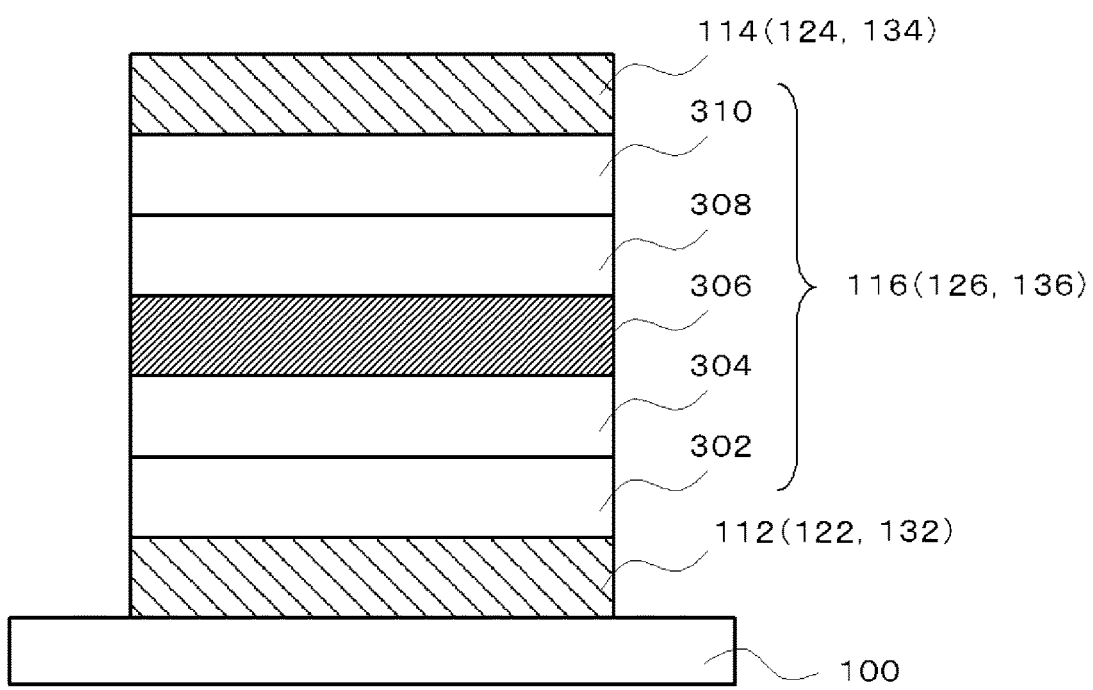
FIG. 4 is a cross-sectional view for illustrating the structure of a first luminous body.

FIG. 4 is a cross-sectional view for illustrating the structure of the first luminous body 116. Furthermore, the second luminous body 126 and the third luminous body 136 have the same structure as that of the first luminous body 116.

The first luminous body 116 has a laminated structure in which a hole injection layer 302, a hole transport layer 304, a light emitting layer 306 (the first organic light emitting layer: the second organic light emitting layer in a case of the second luminous body 126), an electron transport layer 308, and an electron injection layer 310 are laminated on the first anode 112 in this order. Each of these layers may be formed by either a coating method or a vapor deposition method. Furthermore, when the layers are formed by a vapor deposition method, as a material of each of the layers, the following are exemplified.

As a phosphorescent organic compound used in the light emitting layer 306, Bis(3,5-difluoro-2-(2-pyridyl) phenyl-(2-carboxypyridyl) iridium(III), Tris(2-phenylpyridine) iridium(III), and Bis(2-phenylbenzothiazolato) (acetylacetonate) iridium(III) which are iridium complexes, Osmium(II) bis(3-trifluoromethyl-5-(2-pyridyl)-pyrazolate) dimethylphenylphosphine which is an osmium complex, Tris(dibenzoylmethane) phenanthroline europium(III) of a rare earth compound, 2,3,7,8,12,13,17,18-Octaethyl-21H, 23H-porphine, platinum(II) which is a platinum complex, and the like are able to be exemplified.

In addition, as an organic compound having electron transport properties which is a main component of the light emitting layer 306, the electron transport layer 308, and the electron injection layer 310, a polycyclic compound such as p-terphenyl and quaterphenyl and a derivative thereof, a condensed polycyclic hydrocarbon compound such as naphthalene, tetracene, pyrene, coronene, chrysene, anthracene, diphenyl anthracene, naphthacene, and phenanthrene and a derivative thereof, a condensed heterocyclic compound such as phenanthroline, bathophenanthroline, phenanthridine, acridine, quinoline, quinoxaline, and phenazine and a derivative thereof, fluorescein, perylene, phthaloperylene, naphthaloperylene, perynone, phthaloperinone, naphthaloperinone, diphenyl butadiene, tetraphenyl butadiene, oxadiazole, aldazine, bisbenzoxazoline, bisstyryl, pyrazine, cyclopentadiene, oxine, amino quinoline, imine, diphenyl ethylene, vinyl anthracene, diaminocarbazole, pyran, thiopyran, polymethine, merocyanine, quinacridone, rubrene, and the like, a derivative thereof, and the like are able to be exemplified.

Further, as the organic compound having electron transport properties, a metal chelate complex compound, in particular, in a metal chelated oxanoid compound, 8-quinolinolato such as tris(8-quinolinolato) aluminum, bis(8-quinolinolato) magnesium, bis[benzo(f)-8-quinolinolato] zinc, bis(2-methyl-8-quinolinolato) (4-phenyl-phenolato) aluminum, tris(8-quinolinolato) indium, tris(5-methyl-8-quinolinolato) aluminum, 8-quinolinolato lithium, tris(5-chloro-8-quinolinolato) gallium, and bis(5-chloro-8-quinolinolato) calcium or a metal complex having at least one derivative thereof as a ligand are able to be exemplified.

In addition, as the organic compound having electron transport properties, oxadiazoles, triazines, a stilbene derivative and a distyrylarylene derivative, a styryl derivative, and a diolefin derivative are able to be preferably used.

Further, as an organic compound which is able to be used as the organic compound having electron transport properties, benzoxazoles such as 2,5-bis(5,7-di-t-bentyl-2-benzoxazolyl)-1,3,4-thiazole, 4,4'-bis(5,7-t-pentyl-2-benzoxazolyl) stilbene, 4,4'-bis[5,7-di-(2-methyl-2-butyl)-2-benzoxazolyl] stilbene, 2,5-bis(5,7-di-t-pentyl-2-benzoxazolyl) thiophene, 2,5-bis[5-(α,α-dimethyl benzyl)-2-benzoxazolyl] thiophene, 2,5-bis[5,7-di-(2-methyl-2-butyl)-2-benzoxazolyl]-3,4-diphenyl thiophene, 2,5-bis(5-methyl-2-benzoxazolyl) thiophene, 4,4'-bis(2-benzoxazolyl) biphenyl, 5-methyl-2-{2-[4-(5-methyl-2-benzoxazolyl) phenyl] vinyl} benzoxazole, and 2-[2-(4-chlorophenyl) vinyl] naphtho(1,2-d) oxazole, benzothiazoles such as 2,2'-(p-phenylene divinylene)-bisbenzothiazole, 2-{2-[4-(2-benzimidazolyl) phenyl] vinyl} benzimidazole, 2-[2-(4-carboxyphenyl) vinyl] benzoimidazole, and the like are included.

Further, as the organic compound having electron transport properties, 1,4-bis(2-methylstyryl) benzene, 1,4-bis(3-methylstyryl) benzene, 1,4-bis(4-methylstyryl) benzene, distyryl benzene, 1,4-bis(2-ethylstyryl) benzene, 1,4-bis(3-ethylstyryl) benzene, 1,4-bis(2-methylstyryl)-2-methyl benzene, 1,4-bis(2-methylstyryl)-2-ethyl benzene, and the like are also included.

In addition, as the organic compound having electron transport properties, 2,5-bis(4-methylstyryl) pyrazine, 2,5-bis(4-ethylstyryl) pyrazine, 2,5-bis[2-(1-naphthyl) vinyl] pyrazine, 2,5-bis(4-methoxystyryl) pyrazine, 2,5-bis[2-(4-biphenyl) vinyl] pyrazine, 2,5-bis[2-(1-pyrenyl) vinyl] pyrazine, and the like are included.

In addition, as the organic compound having electron transport properties, a known material such as 1,4-phenylene dimethylidine, 4,4'-phenylene dimethylidine, 2,5-xylylene dimethylidine, 2,6-naphthylene dimethylidine, 1,4-biphenylene dimethylidine, 1,4-p-terphenylene dimethylidine, 9,10-anthracenediyl dimethylidine, 4,4'-(2,2-di-t-butylphenylvinyl) biphenyl, and 4,4'-(2,2-diphenylvinyl) biphenyl which is used in manufacturing an organic EL element of the related art is able to be suitably used.

On the other hand, as an organic compound having hole transport properties which is used in the hole transport layer 304 or the light emitting layer having hole transport properties, N,N,N',N'-tetraphenyl-4,4'-diaminophenyl, N,N'-diphenyl-N,N'-di(3-methyl phenyl)-4,4'-diaminobiphenyl, 2,2-bis(4-di-p-tolylaminophenyl) propane, N,N,N',N'-tetra-p-tolyl-4,4'-diaminobiphenyl, bis(4-di-p-tolylaminophenyl) phenyl methane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino) quadriphenyl, 4-N,N-diphenylamino-(2-diphenylvinyl) benzene, 3-methoxy-4'-N,N-diphenylamino stilbenzene, N-phenyl carbazole, 1,1-bis(4-di-p-triaminophenyl)-cyclohexane, 1,1-bis(4-di-p-triaminophenyl)-4-phenyl cyclohexane, bis(4-dimethylamino-2-methylphenyl)-phenyl methane, N,N,N-tri(p-tolyl) amine, 4-(di-p-tolylamino)-4'-[4(di-p-tolylamino) styryl] stilbene, N,N,N',N'-tetra-p-tolyl-4,4'-diamino-biphenyl, N,N,N',N'-tetraphenyl-4,4'-diamino-biphenyl N-phenyl carbazole, 4,4'-bis[N-(1-naphthyl)-N-phenyl-amino] biphenyl, 4,4"-bis[N-(1-naphthyl)-N-phenyl-amino] p-terphenyl, 4,4'-bis[N-(2-naphthyl)-N-phenyl-amino] biphenyl, 4,4'-bis[N-(3-acenaphthenyl)-N-phenyl-amino] biphenyl, 1,5-bis[N-(1-naphthyl)-N-phenyl-amino] naphthalene, 4,4'-bis[N-(9-anthryl)-N-phenyl-amino] biphenyl, 4,4"-bis[N-(1-anthryl)-N-phenyl-amino] p-terphenyl, 4,4'-bis[N-(2-phenanthryl)-N-phenyl-amino] biphenyl, 4,4'-bis[N-(8-fluoranthenyl)-N-phenyl-amino] biphenyl, 4,4'-bis[N-(2-pyrenyl)-N-phenyl-amino] biphenyl, 4,4'-bis[N-(2-perylenyl)-N-phenyl-amino] biphenyl, 4,4'-bis[N-(1-coronenyl)-N-phenyl-amino] biphenyl, 2,6-bis(di-p-tolylamino) naphthalene, 2,6-bis[di-(1-naphthyl) amino] naphthalene, 2,6-bis[N-(1-naphthyl)-N-(2-naphthyl) amino] naphthalene, 4,4"-bis[N,N-di(2-naphthyl) amino] terphenyl, 4,4'-bis{N-phenyl-N-[4-(1-naphthyl) phenyl] amino} biphenyl, 4,4'-bis[N-phenyl-N-(2-pyrenyl)-amino] biphenyl, 2,6-bis[N,N-di(2-naphthyl) amino] fluorene, 4,4"-bis(N,N-di-p-tolylamino) terphenyl, bis(N-1-naphthyl) (N-2-naphthyl) amine, and the like are able to be exemplified.

Further, as the organic compound having the hole transport properties, a material in which the above-described organic compounds are dispersed in a polymer, and material obtained by polymerizing the above-described organic compounds are also able to be used. A so-called n-conjugated polymer such as poly-para-phenylene vinylene and a derivative thereof, a hole transporting non-conjugated polymer represented by poly(N-vinylcarbazole), and a sigma conjugated polymer such as polysilanes are also able to be used.

The material of the hole injection layer 302 is not particularly limited, and as the material, metal phthalocyanines such as copper phthalocyanine (CuPc) and metal-free phthalocyanines, a carbon film, a conductive polymer such as polyaniline are able to be preferably used.

Next, a manufacturing method of the light emitting apparatus 10 illustrated in FIG. 1 and FIG. 2 will be described. First, a conductive film which becomes the first anode 112, the second anode 122, and the third anode 132, for example, is formed on the substrate 100 by a sputtering method. Subsequently, a mask pattern (for example, a resist pattern) is formed on the conductive film, and the conductive film is etched by using the mask pattern as a mask. Accordingly, the first anode 112, the second anode 122, and the third anode 132 are formed.

Subsequently, a photosensitive insulating film, for example, a polyimide film is formed on the substrate 100, on the first anode 112, on the second anode 122, and on the third anode 132, and the insulating film is exposed and developed. Accordingly, the insulating layer 140 is formed. Subsequently, a photosensitive insulating film, for example, a resist film is formed on the first anode 112, on the second anode 122, on the third anode 132, and on the insulating layer 140, and the resist film is exposed and developed. Accordingly, the partition wall 150 having a reversely tapered cross-sectional surface is formed.

Subsequently, the first luminous body 116 is formed on the first anode 112 by a vapor deposition method using a shadow mask. In addition, the second luminous body 126 is formed on the second anode 122 by a vapor deposition method using a shadow mask. In addition, the third luminous body 136 is formed on the third anode 132 by a vapor deposition method using a shadow mask.

Subsequently, a conductive film which becomes the first cathode 114, the second cathode 124, and the third cathode 134, for example, is formed by a vapor deposition method. In this step, the partition wall 150 having a reversely tapered cross-sectional surface covers a space between the first luminous body 116 and the second luminous body 126, a space between the second luminous body 126 and the third luminous body 136, and a space between the third luminous body 136 and the first luminous body 116. For this reason, the first cathode 114, the second cathode 124, and the third cathode 134 are formed to be separated from each other.

Furthermore, the manufacturing method of the light emitting apparatus 10 is not limited to the examples described above.

Figure 5:
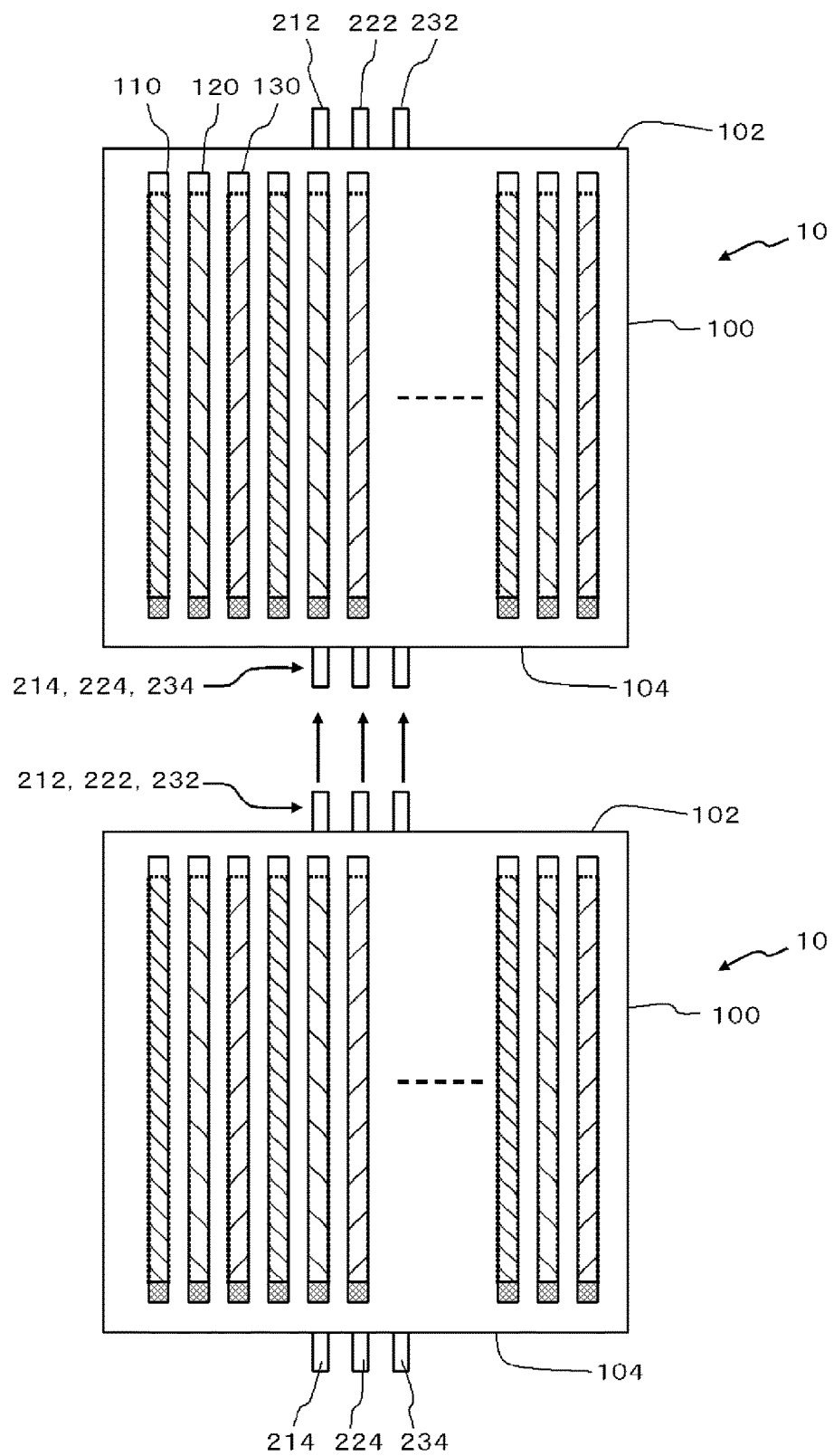
FIG. 5 is a diagram illustrating an arrangement method of a plurality of light emitting apparatuses.
Figure 6:
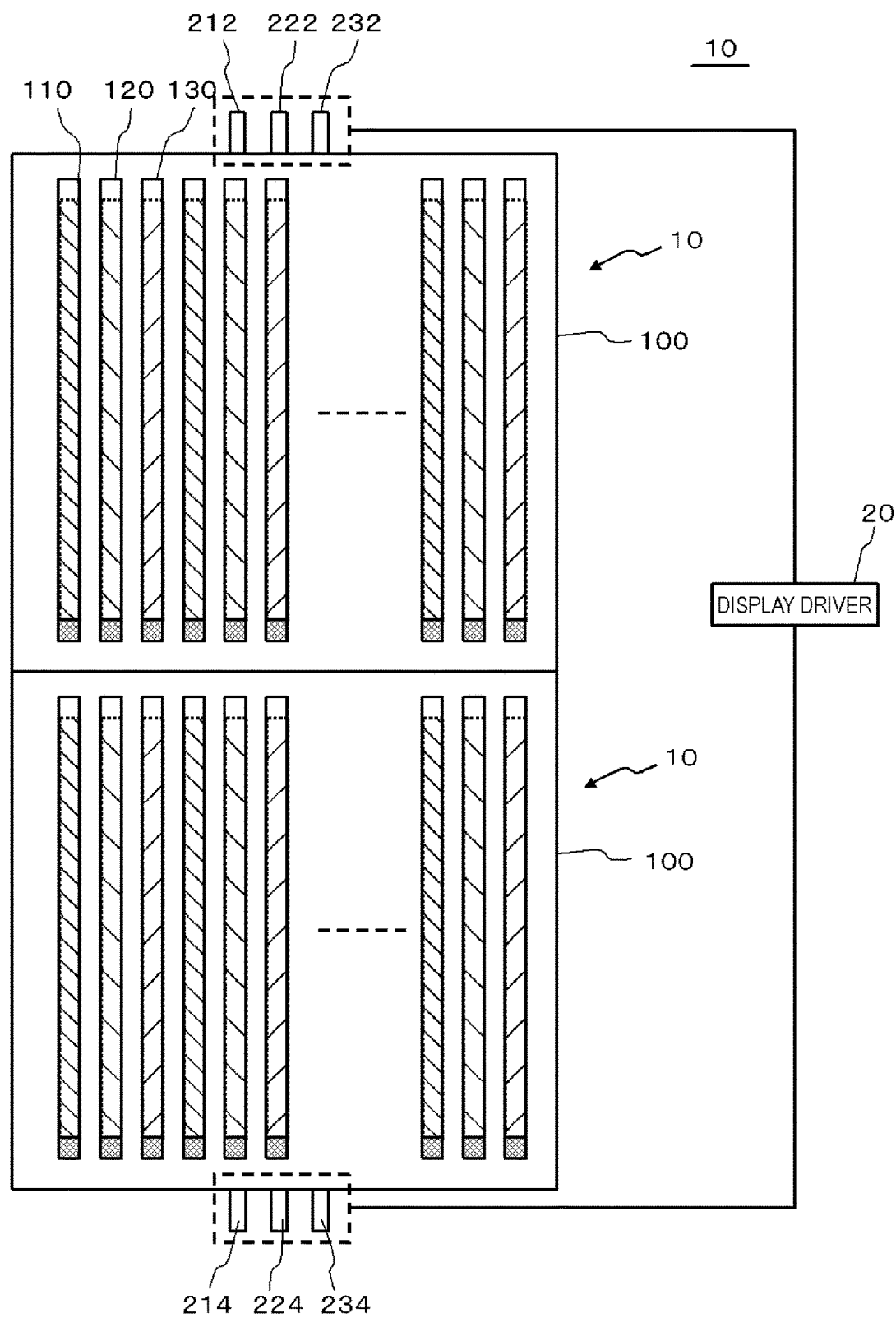
FIG. 6 is a diagram illustrating the arrangement method of the plurality of light emitting apparatuses.

FIG. 5 and FIG. 6 are diagrams illustrating an arrangement method of a plurality of light emitting apparatuses 10.

When the substrate 100 is rectangular, the first anode terminal 212, the second anode terminal 222, and the third anode terminal 232 are disposed on the side 102 of the substrate 100, and the first cathode terminal 214, the second cathode terminal 224, and the third cathode terminal 234 are disposed on the side 104 of the substrate 100. For this reason, the side 102 of one light emitting apparatus 10 overlaps with the side 104 of the other light emitting apparatus 10, and thus the first anode terminal 212, the second anode terminal 222, and the third anode terminal 232 of the one light emitting apparatus 10 are able to be connected to the first cathode terminal 214, the second cathode terminal 224, and the third cathode terminal 234 of the other light emitting apparatus 10.

Then, as illustrated in FIG. 6, a light emitting driver 20 is connected between the first anode terminal 212, the second anode terminal 222, and the third anode terminal 232 of the light emitting apparatus 10 positioned on the farthest upstream side of a current flow, and the first cathode terminal 214, the second cathode terminal 224, and the third cathode terminal 234 of the light emitting apparatus 10 positioned on the farthest downstream side of the current flow. That is, in this embodiment, serially connected bodies in which a plurality of light emitting apparatuses 10 are connected in series share the light emitting driver 20. The number of voltages which is able to be controlled by the display driver 20 is small at three, and thus the structure of the light emitting driver 20 becomes simple.

Figure 7:
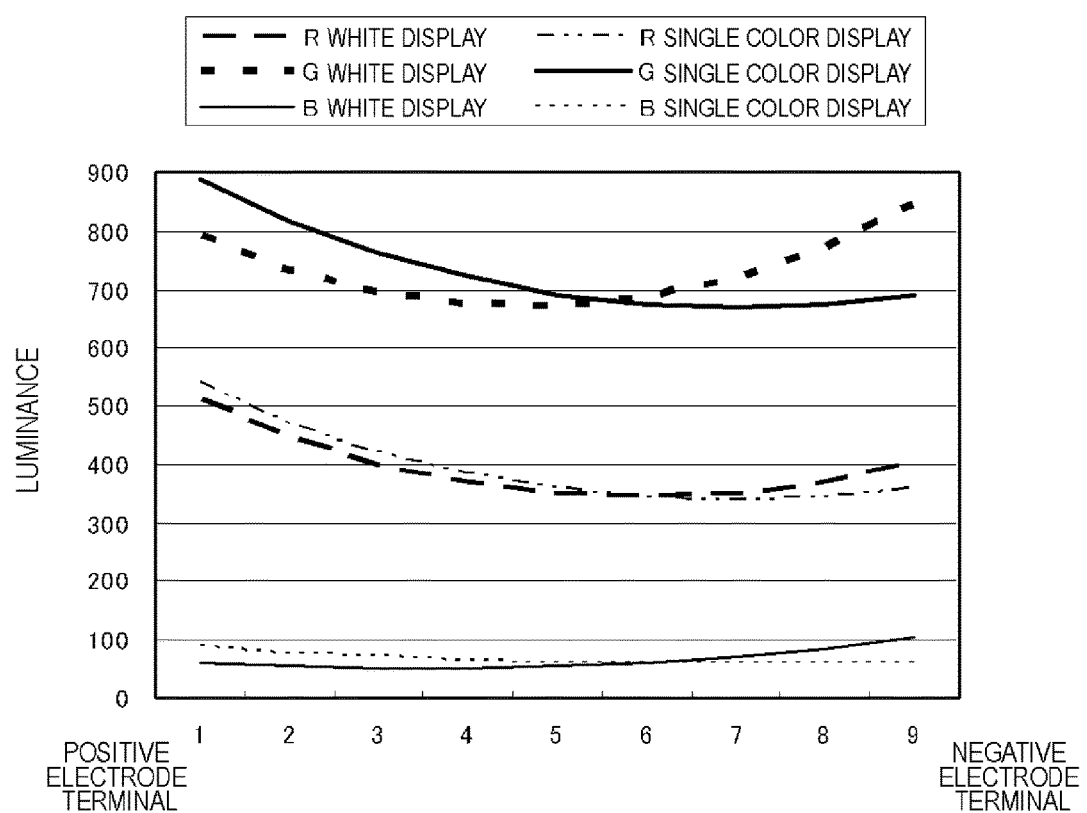
FIG. 7 is a graph illustrating the distribution of luminance in an extending direction of a first luminescent line, a second luminescent line, and a third luminescent line in a reference example.

FIG. 7 is a graph illustrating the distribution of luminance in the extending direction of the first luminescent line 110, the second luminescent line 120, and the third luminescent line 130 in a reference example. In this example, the first cathode 114, the second cathode 124, and the third cathode 134 are identical solid electrodes. The first luminescent line 110, the second luminescent line 120, and the third luminescent line 130 emit light of a red color, a green color, and a blue color, respectively.

When light of a white color is desired to be emitted from the light emitting apparatus 10, it is necessary to allow the first luminescent line 110, the second luminescent line 120, and the third luminescent line 130 to emit light at the same time. In an example illustrated in this drawing, when the first luminescent line 110, the second luminescent line 120, and the third luminescent line 130 emit light at the same time, a difference between luminance on the anode terminal side (luminance on the side 102 side in FIG. 1) and luminance on the cathode terminal side (luminance on the side 104 side in FIG. 1) of the first luminescent line 110, the second luminescent line 120, and the third luminescent line 130 is small. However, when the first luminescent line 110, the second luminescent line 120, and the third luminescent line 130 emit light independently, the difference between the luminance on the anode terminal side (the luminance on the side 102 side in FIG. 1) and the luminance on the cathode terminal side (the luminance on the side 104 side in FIG. 1) of all of the first luminescent line 110, the second luminescent line 120, and the third luminescent line 130 is large.

The present inventors considered the reason therefore to be as follows. When the first luminescent line 110, the second luminescent line 120, and the third luminescent line 130 emit light at the same time, the amount of current flowing through the solid electrode is large compared to a case where the first luminescent line 110, the second luminescent line 120, and the third luminescent line 130 emit light independently. For this reason, when only the first luminescent line 110 emits light, the amount of current flowing through the first luminescent line 110 is different from the case where the first luminescent line 110, the second luminescent line 120, and the third luminescent line 130 emit light at the same time even when the same voltage as that in a case where the first luminescent line 110, the second luminescent line 120, and the third luminescent line 130 emit light at the same time is applied to the first luminescent line 110. The same applies to the second luminescent line 120 and the third luminescent line 130. For this reason, in both the case where the first luminescent line 110, the second luminescent line 120, and the third luminescent line 130 emit light at the same time, and the case where the first luminescent line 110, the second luminescent line 120, and the third luminescent line 130 emit light independently, it is difficult to make the difference between the luminance on the anode terminal side (the luminance on the side 102 side in FIG. 1) and the luminance on the cathode terminal side (the luminance on the side 104 side in FIG. 1) small.

In contrast, in this embodiment, the first anode 112, the second anode 122, and the third anode 132 are independent from each other, and the first anode 112, the second anode 122, and the third anode 132 are independent from each other. For this reason, a condition of the case where the first luminescent line 110, the second luminescent line 120, and the third luminescent line 130 emit light at the same time is identical to a condition of the case where the first luminescent line 110, the second luminescent line 120, and the third luminescent line 130 emit light independently. Accordingly, in both the case where the first luminescent line 110, the second luminescent line 120, and the third luminescent line 130 emit light at the same time, and the case where the first luminescent line 110, the second luminescent line 120, and the third luminescent line 130 emit light independently, it is possible to make the difference between the luminance on the anode terminal side (the luminance on the side 102 side in FIG. 1) and the luminance on the cathode terminal side (the luminance on the side 104 side in FIG. 1) small. For example, when the higher luminance between the luminance on the anode terminal side and luminance on the cathode terminal side is $\alpha$, and the lower luminance is $\beta$, it is possible to set $(\alpha-\beta)/\alpha<0.30$.

Here, an effect of setting $(\alpha-\beta)/\alpha<0.30$ will be described with reference to FIG. 11. FIG. 11 illustrates a result of investigating the extent to which an observer recognizes the boundary line according to the magnitude of $(\alpha-\beta)/\alpha$. As illustrated in this drawing, in the case that $(\alpha-\beta)/\alpha<0.1$, the observer rarely recognizes the boundary line in any luminescent pattern. In addition, in the case that $(\alpha-\beta)/\alpha=0.2$, the observer rarely recognizes the boundary line excluding a part of the luminescent pattern. However, in the case that $(\alpha-\beta)/\alpha=0.30$, the observer recognizes the boundary line in any luminescent pattern. As mentioned above, it is preferable to set $(\alpha-\beta)/\alpha<0.30$.

In addition, even when each voltage input into the first luminescent line 110, the second luminescent line 120, and the third luminescent line 130 is changed, it is possible to prevent a distribution of luminance therefrom from being changed.

As described above, according to this embodiment, in a range overlapping with the first luminous body 116 when seen in a plan view, the first anode 112 is not connected to the second anode 122, and the first cathode 114 is not connected to the second cathode 124. For this reason, properties (for example, a size of resistance) of the first anode 112 and the first cathode 114, and properties of the second anode 122 and the second cathode 124 are able to be designed independently of each other. In addition, as described with reference to FIG. 7, it is possible to make the first luminescent line 110, the second luminescent line 120, and the third luminescent line 130 emit light at the same time coincident with the condition of the case where the first luminescent line 110, the second luminescent line 120, and the third luminescent line 130 emit light independently. Accordingly, in both the case where the first luminescent line 110, the second luminescent line 120, and the third luminescent line 130 emit light at the same time, and the case where the first luminescent line 110, the second luminescent line 120, and the third luminescent line 130 emit light independently, it is possible to make the difference between the luminance on the anode terminal side (the luminance on the side 102 side in FIG. 1) and the luminance on the cathode terminal side (the luminance on the side 104 side in FIG. 1) small. Accordingly, it is possible to make a difference in luminance of the boundary line between the adjacent light emitting apparatuses 10 fall within a constant range.

Furthermore, in the example described above, each of the first luminescent line 110, the second luminescent line 120, and the third luminescent line 130 extends linearly. However, a planar layout of the first luminescent line 110, the second luminescent line 120, and the third luminescent line 130 is not limited thereto.

Figure 8:
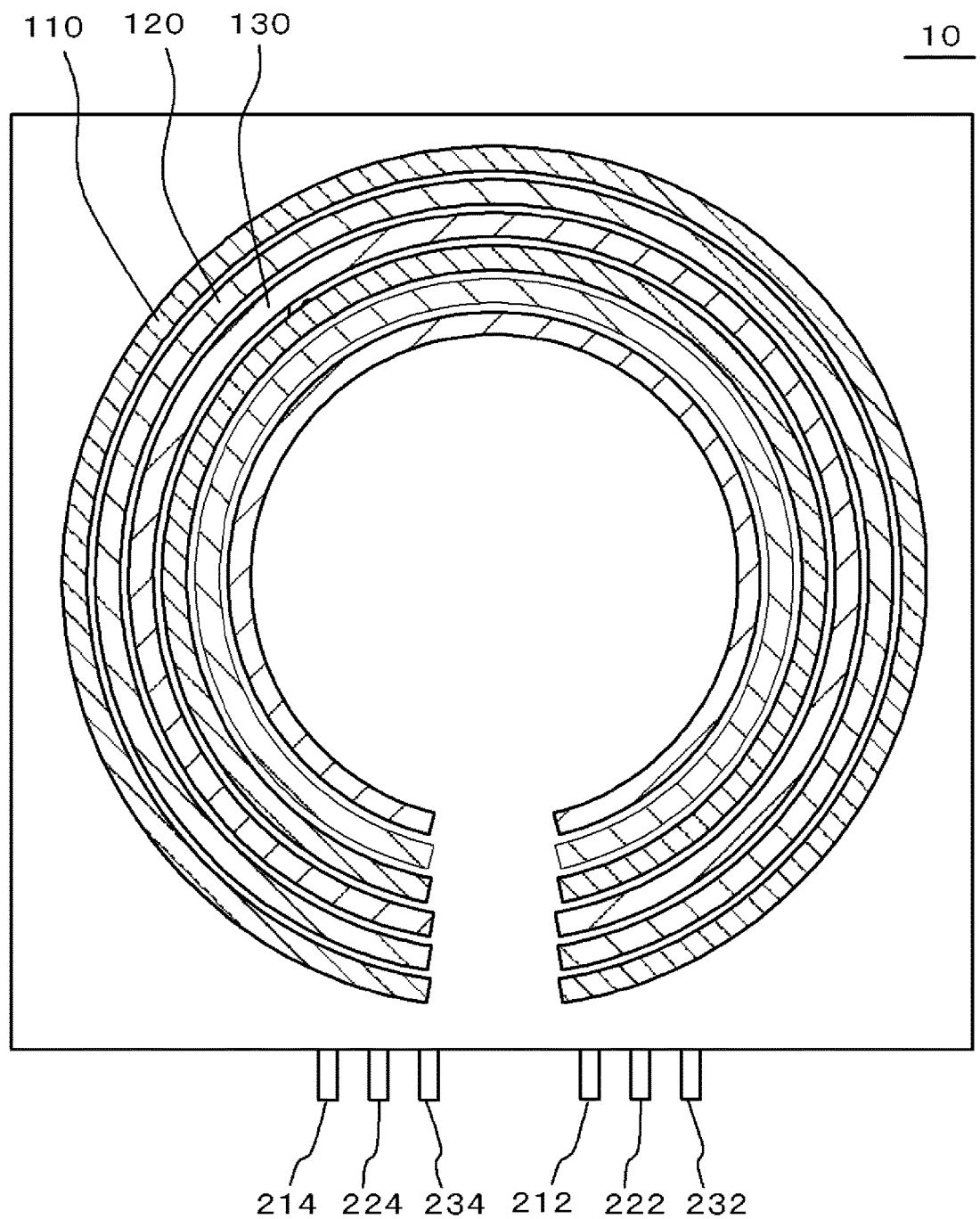
FIG. 8 is a diagram illustrating a modification example of FIG. 1.

For example, as illustrated in FIG. 8, the first luminescent line 110, the second luminescent line 120, and the third luminescent line 130 may be arranged to draw a coaxial circle. In this case, the first anode terminal 212, the second anode terminal 222, and the third anode terminal 232 are formed on the same side as that of the first cathode terminal 214, the second cathode terminal 224, and the third cathode terminal 234. Then, the first luminescent line 110, the second luminescent line 120, and the third luminescent line 130 are not formed in a portion facing the first anode terminal 212, the second anode terminal 222, the third anode terminal 232, the first cathode terminal 214, the second cathode terminal 224, and the third cathode terminal 234.

Figure 9:
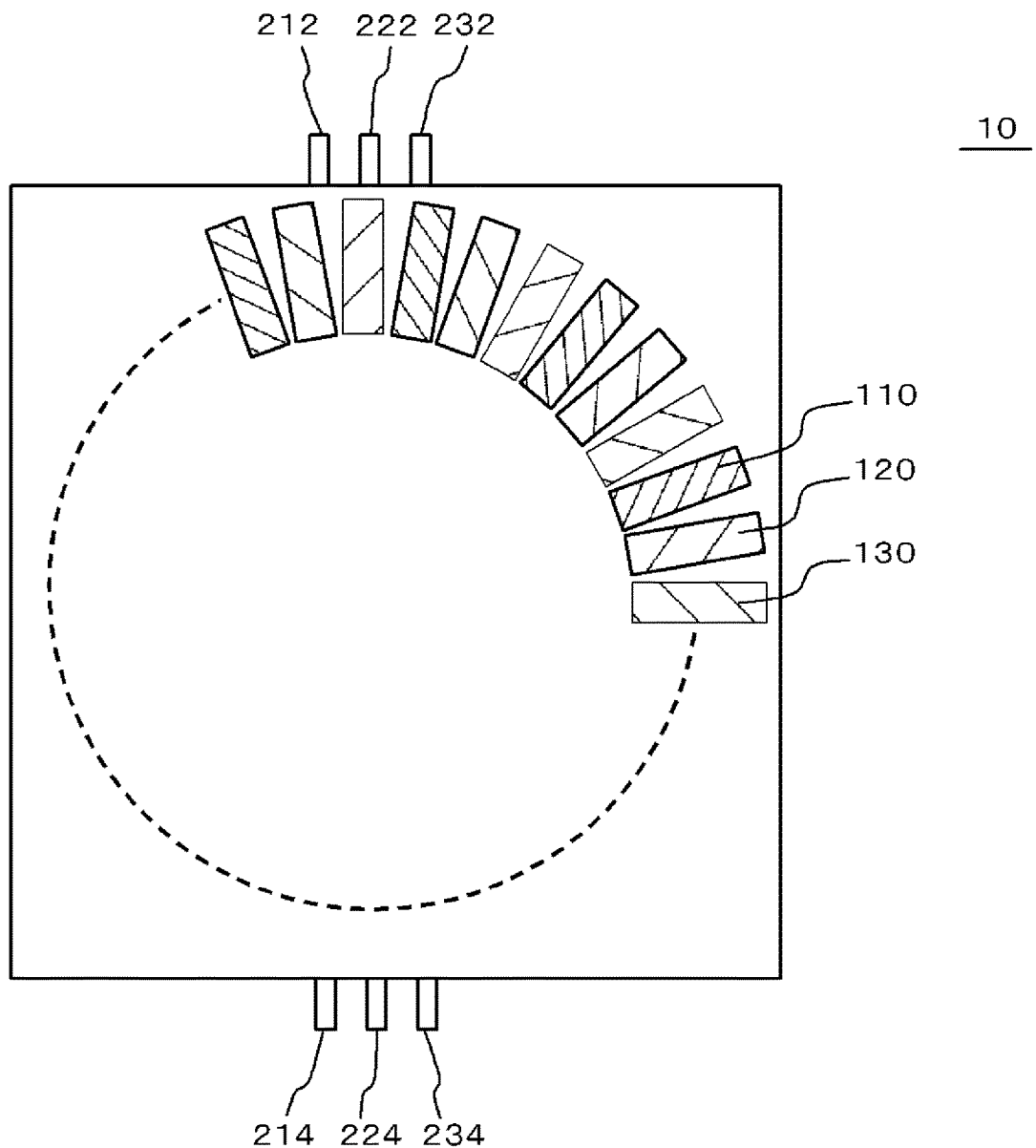
FIG. 9 is a diagram illustrating a modification example of FIG. 1.

In addition, as illustrated in FIG. 9, the first luminescent line 110, the second luminescent line 120, and the third luminescent line 130 may be repeatedly and radially arranged along an arc.

Second Embodiment

Figure 10:
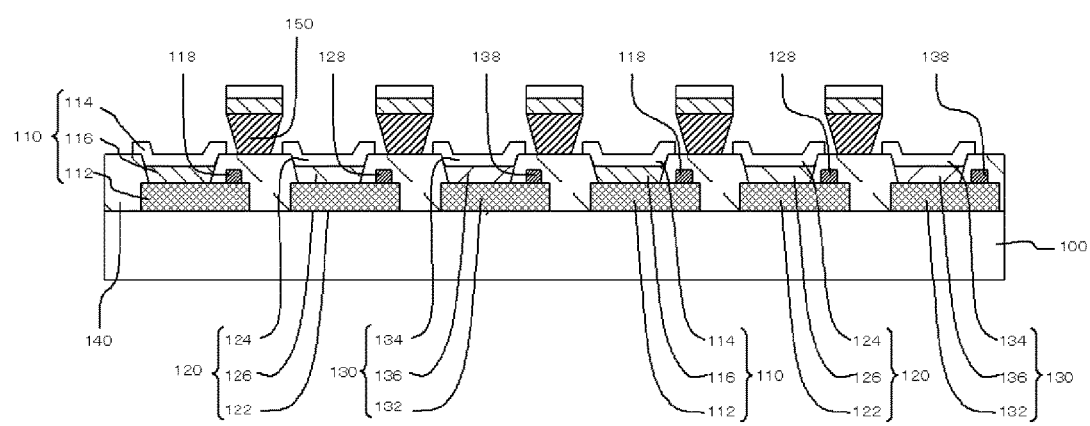
FIG. 10 is a cross-sectional view for illustrating a configuration of a light emitting apparatus 10 according to a second embodiment.

FIG. 10 is a cross-sectional view for illustrating a configuration of the first luminescent line 110, the second luminescent line 120, and the third luminescent line 130 included in the light emitting apparatus 10 according to a second embodiment. The light emitting apparatus 10 according to this embodiment has the same configuration as that of the light emitting apparatus 10 according to the first embodiment except for the following.

In this embodiment, the first anode 112, the second anode 122, and the third anode 132 are transparent electrodes. The first anode 112 is formed to be wider than the first luminous body 116 and the first cathode 114. The same applies to the second anode 122 and the third anode 132.

Then, an auxiliary electrode 118 is formed in a portion of the first anode 112 protruding from the first luminous body 116. The auxiliary electrode 118 is formed of a material having resistance lower than that of the first anode 112, for example, a metal material such as Al. The auxiliary electrode 118 extends in the same direction as the first anode 112.

Furthermore, an auxiliary electrode 128 is formed on the second anode 122, and an auxiliary electrode 138 is formed on the third anode 132. The configuration of the auxiliary electrode 128 and the auxiliary electrode 138 is identical to the configuration of the auxiliary electrode 118.

According to this embodiment, the same effect as that of the first embodiment is able to be obtained. In addition, the auxiliary electrodes 118, 128, and 138 are disposed in parallel with the first anode 112, the second anode 122, and the third anode 132 which are transparent electrodes, and thus it is possible to easily make a resistance value of the first anode 112, the second anode 122, and the third anode 132 per unit length close to a resistance value of the first cathode 114, the second cathode 124, and the third cathode 134 per unit length.

As described above, the embodiments of the present invention are described with reference to the drawings, but the embodiments are an example of the present invention, and other various configurations in addition to the above configuration are able to be adopted.

The invention claimed is:

1. An organic EL device comprising a light emitting member, the light emitting member comprising:
   a first cathode on a substrate, and a first luminous body interposed between a first anode and the first cathode; and
   a second cathode on a substrate, and a second luminous body interposed between a second anode and the second cathode,
   wherein the first luminous body is next to the second luminous body, and
   the first anode is not connected to the second anode and the second cathode, and the first cathode is not connected to the second anode and the second cathode.

2. The organic EL device according to claim 1, further comprising:
   a plurality of the light emitting members,
      wherein the plurality of the light emitting members are connected in series.

3. The organic EL device according to claim 1,
   wherein the light emitting member includes a first anode terminal connected to the first anode, a second anode terminal connected to the second anode, a first cathode terminal connected to the first cathode, and a second cathode terminal connected to the second cathode.

4. The organic EL device according to claim 3, further comprising:
   a plurality of the light emitting members,
      wherein the first anode terminal of one light emitting member is connected to the first cathode terminal of another light emitting member next to the one light emitting member, and the second anode terminal of the one light emitting member is connected to the second cathode terminal of the another light emitting member next to the one light emitting member.

5. The organic EL device according to claim 4,
   wherein the first anode terminal of the one light emitting member is connected in series to the first cathode terminal of the another light emitting member next to the one light emitting member, and the second anode terminal of the one light emitting member is connected in series to the second cathode terminal of the another light emitting member next to the one light emitting member.

6. The organic EL device according to claim 1,
   wherein a color of light emitted from the first luminous body is different from a color of light emitted from the second luminous body.

7. The organic EL device of claim 1, wherein the first luminous body and the second luminous body extend in one or more of a circular, linear, or arc arrangement.

8. The organic EL device of claim 1, wherein the first luminous body and the second luminous body are arranged in a coaxial circle.

9. The organic EL device of claim 1, wherein the first luminous body and the second luminous body are arranged along an arc.

10. The organic EL device of claim 9, wherein the first luminous body and the second luminous body are arranged along the arc in at least one of radially and repeatedly.

11. The organic EL device of claim 3,
wherein the substrate is rectangular, the first anode terminal and the second anode terminal are disposed on a first side of the substrate, and
the first cathode terminal and the second cathode terminal are disposed on a second side of the substrate opposite to the first side.

12. The organic EL device according to claim 1, wherein a resistance value of the first anode per unit length is approximately identical to a resistance value of the first cathode per unit length.

13. The organic EL device according to claim 1,
wherein one of an anode group including the first anode and the second anode and a cathode group including the first cathode and the second cathode is a transparent electrode, and the other is a metal electrode, and
the light emitting apparatus further comprises an auxiliary electrode which is disposed in parallel with the transparent electrode, and is formed of a material having resistance lower than that of a material configuring the transparent electrode.

* * * * *